(12) United States Patent
Goyal et al.

(10) Patent No.: US 11,588,487 B1
(45) Date of Patent: Feb. 21, 2023

(54) EYE OPENING MONITOR DEVICE AND OPERATION METHOD THEREOF

(71) Applicant: Faraday Technology Corp., Hsinchu (TW)

(72) Inventors: Prateek Kumar Goyal, Hsinchu (TW); Chienlung Kung, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 17/488,338

(22) Filed: Sep. 29, 2021

(51) Int. Cl.
  *H03L 7/08* (2006.01)
  *H03L 7/081* (2006.01)
  *H04L 7/00* (2006.01)

(52) U.S. Cl.
  CPC .......... *H03L 7/0812* (2013.01); *H03L 7/0807* (2013.01); *H04L 7/0079* (2013.01)

(58) Field of Classification Search
  CPC .... H03L 7/0812; H03L 7/0807; H04L 7/0079
  See application file for complete search history.

(56) References Cited

U.S. PATENT DOCUMENTS

| | | |
|---|---|---|
| 7,098,714 B2 | 8/2006 | Lin |
| 7,325,175 B2 | 1/2008 | Momtaz |
| 7,627,029 B2 * | 12/2009 | Ho ................... H04L 25/03006 375/232 |
| 9,184,909 B1 * | 11/2015 | McCracken ............ H04L 7/042 |
| 10,014,907 B2 | 7/2018 | Choi et al. |
| 10,785,072 B2 * | 9/2020 | Hormati ................. H04L 7/0087 |
| 2004/0123207 A1 | 6/2004 | Zumkehr et al. |
| 2006/0140321 A1 * | 6/2006 | Tell ........................ H04L 7/033 375/376 |
| 2011/0170644 A1 * | 7/2011 | Iqbal ..................... H04L 7/0337 375/355 |

OTHER PUBLICATIONS

"Office Action of Taiwan Counterpart Application", dated Nov. 16, 2022, pp. 1-7.

* cited by examiner

*Primary Examiner* — Dac V Ha
(74) *Attorney, Agent, or Firm* — JCIPRNET

(57) ABSTRACT

An eye opening monitor device and an operation method thereof are provided. The eye opening monitor device includes a phase interpolator, a first sampling circuit, a second sampling circuit, and a clock centering circuit. The first sampling circuit samples a data signal according to a data clock to generate first sampled data. The second sampling circuit samples the data signal according to a phase interpolation clock to generate second sampled data. The phase interpolator changes a phase of the phase interpolation clock according to a phase interpolation code. The clock centering circuit counts multiple comparison results of the first sampled data and the second sampled data in multiple clock cycles to obtain an error count value for any one of different phase interpolation codes. The clock centering circuit determines the phase interpolation code provided to the phase interpolator based on the error count values corresponding to different phase interpolation codes.

19 Claims, 10 Drawing Sheets

EYE OPENING MONITOR DEVICE AND OPERATION METHOD THEREOF

BACKGROUND

Technical Field

The disclosure relates to a signal transmission device, and particularly relates to an eye opening monitor device and an operation method thereof.

Description of Related Art

The eye pattern is a tool to evaluate the signal quality between different devices. The larger the "eye opening" of the eye pattern, the better the signal quality. If a signal is distorted due to noise or interference, the "eye opening" of the eye pattern will become smaller. The eye opening monitor (EOM) is commonly applied to a serializer/deserializer (SerDes) and/or other electronic circuits to monitor the eye opening of the signal. In order to monitor the eye opening in the X-axis direction of the eye pattern, a phase interpolator is configured in the clock path of the electronic circuit to change a clock phase (that is, an X-axis position of a clock in the eye pattern).

For a data sampling operation, the electronic circuit (for example, the SerDes) uses a data clock to sample a data signal to generate sampled data. In order to perform an eye opening monitoring operation, the electronic circuit uses the phase interpolator to interpolate a phase to a clock signal to generate a phase interpolation clock. Generally, the phase interpolator causes a delay difference between the data clock and the phase interpolation clock. If there is a duty cycle error in the data clock or an error clock that causes two tones, the problem will become worse.

It should be noted that the content of the "Description of Related Art" paragraph is used to help understand the disclosure. Some (or all) of the content disclosed in the "Description of Related Art" paragraph may not be conventional technology known to persons skilled in the art. The content disclosed in the "Description of Related Art" paragraph does not mean that the content has been known to persons skilled in the art before the application of the disclosure.

SUMMARY

The disclosure provides an eye opening monitor device and an operation method thereof, so that a phase of a phase interpolation clock matches a phase of a data clock.

In an embodiment of the disclosure, the eye opening monitor device includes a phase interpolator, a first sampling circuit, a second sampling circuit, and a clock centering circuit. The first sampling circuit is configured to sample a data signal according to a data clock to generate first sampled data. The phase interpolator is configured to receive the data clock. The phase interpolator changes a phase of the data clock based on a phase interpolation code to generate a phase interpolation clock. The second sampling circuit is coupled to the phase interpolator to receive the phase interpolation clock. The second sampling circuit is configured to sample the data signal according to the phase interpolation clock to generate second sampled data. The clock centering circuit is coupled to the first sampling circuit and the second sampling circuit to receive the first sampled data and the second sampled data. The clock centering circuit may change the phase interpolation code to change a phase of the phase interpolation clock. The clock centering circuit counts multiple comparison results of the first sampled data and the second sampled data in multiple clock cycles to obtain an error count value for any one of different phase interpolation codes. The clock centering circuit determines a centering code based on the error count values corresponding to the different phase interpolation codes as the phase interpolation code provided to the phase interpolator.

In an embodiment of the disclosure, the operation method includes the following steps. A first sampling circuit samples a data signal according to a data clock to generate first sampled data. A phase interpolator changes a phase of the data clock based on a phase interpolation code to generate a phase interpolation clock. A second sampling circuit samples the data signal according to the phase interpolation clock to generate second sampled data. A clock centering circuit changes the phase interpolation code to change a phase of the phase interpolation clock. For any one of different phase interpolation codes, the clock centering circuit counts multiple comparison results of the first sampled data and the second sampled data in multiple clock cycles to obtain an error count value. The clock centering circuit determines a centering code based on the error count values corresponding to the different phase interpolation codes as the phase interpolation code provided to the phase interpolator.

Based on the above, the eye opening monitor device according to the embodiments of the disclosure may change the phase of the phase interpolation clock generated by the phase interpolator by changing the phase interpolation code, and then compare the first sampled data and the second sampled data to obtain the comparison result. For any one of the different phase interpolation codes, the clock centering circuit may count multiple comparison results in multiple clock cycles (for example, count the number of errors in the clock cycles) to obtain the error count value. The clock centering circuit may determine/lock the phase interpolation code (the centering code) provided to the phase interpolator based on the error count values corresponding to the different phase interpolation codes, so that the phase of the phase interpolation clock matches the phase of the data clock.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1:
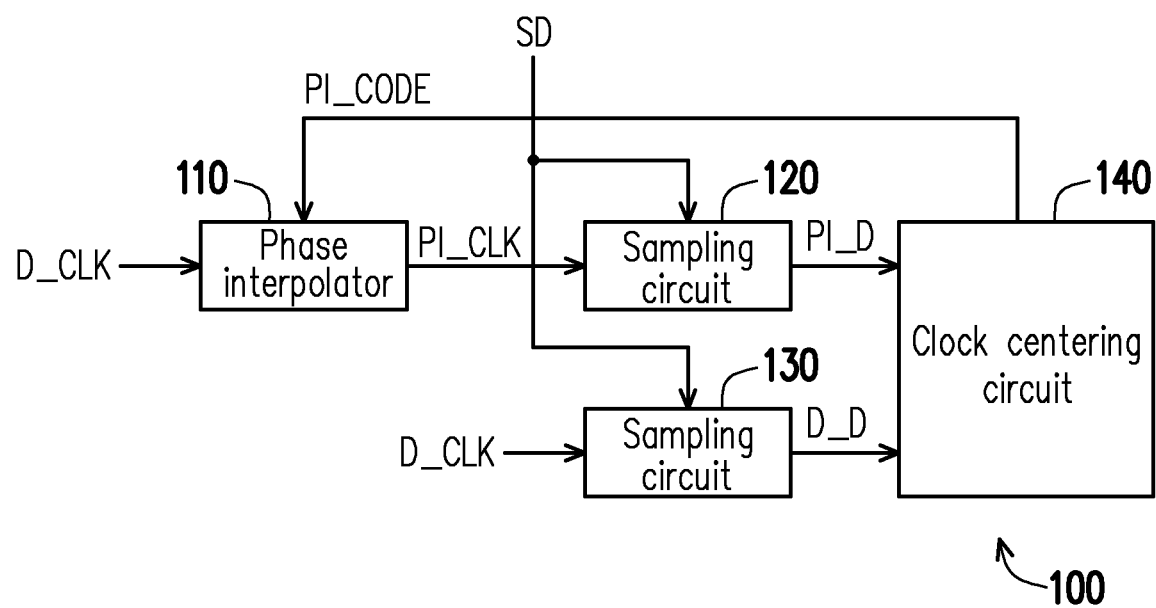
FIG. 1 is a schematic diagram of a circuit block of an eye opening monitor device according to an embodiment of the disclosure.

The term "coupling (or connection)" used in the entire specification (including the claims) of the disclosure may refer to any direct or indirect connection means. For example, if it is described in the text that a first device is coupled (or connected) to a second device, it should be interpreted as that the first device may be directly connected to the second device or the first device may be indirectly connected to the second device through other devices or a certain connection means. Terms such as "first" and "second" mentioned in the entire specification (including the claims) of the disclosure are used to name elements or distinguish different embodiments or ranges and are not used to limit the upper limit or the lower limit of the number of the elements nor limit the sequence of the elements. In addition, wherever possible, elements/components/steps with the same reference numerals in the drawings and embodiments represent the same or similar parts. For elements/components/steps that use the same reference numerals or use the same terms in different embodiments, cross-reference may be made to related descriptions.

FIG. 1 is a schematic diagram of a circuit block of an eye opening monitor device 100 according to an embodiment of the disclosure. The eye opening monitor device 100 shown in FIG. 1 includes a phase interpolator 110, a sampling circuit 120, a sampling circuit 130, and a clock centering circuit 140. The phase interpolator 110 may receive a data clock D_CLK and generate a phase interpolation clock PI_CLK. The sampling circuit 120 is coupled to the phase interpolator 110 to receive the phase interpolation clock PI_CLK. The clock centering circuit 140 is coupled to the sampling circuit 120 and the sampling circuit 130 to receive second sampled data (sampled data PI_D) and first sampled data (sampled data D_D).

Figure 2:
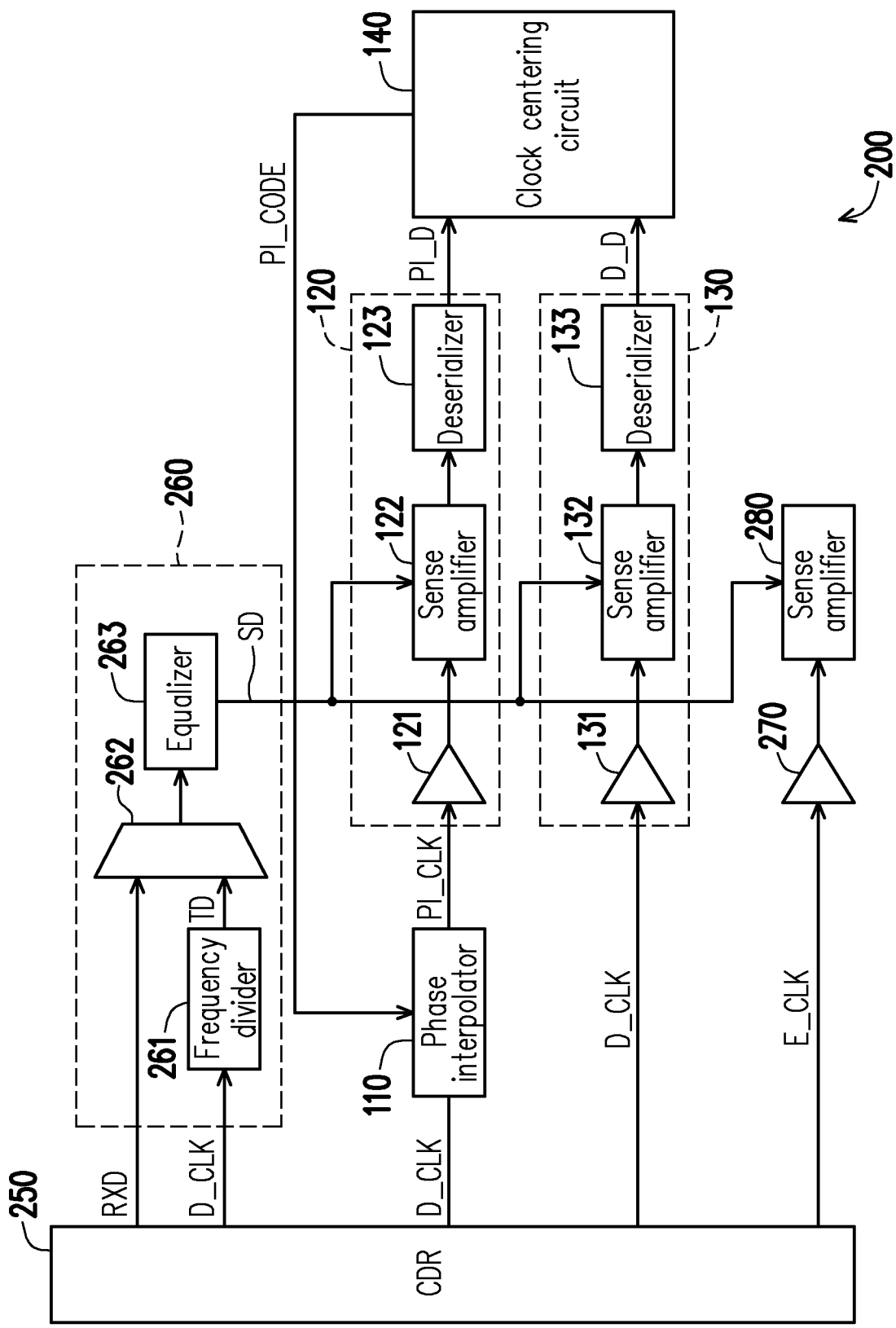
FIG. 2 is a schematic diagram of a circuit block of an eye opening monitor device applied to a serializer/deserializer according to an embodiment of the disclosure.

The eye opening monitor device 100 shown in FIG. 1 may be applied to any electronic circuit according to actual design. For example, the eye opening monitor device 100 may be applied to a serializer/deserializer (SerDes) and/or other electronic circuits. For example, FIG. 2 is a schematic diagram of a circuit block of an eye opening monitor device 200 applied to a serializer/deserializer according to an embodiment of the disclosure. The eye opening monitor device 200 shown in FIG. 2 includes the phase interpolator 110, the sampling circuit 120, the sampling circuit 130, the clock centering circuit 140, a clock data recovery (CDR) circuit 250, and a data switch circuit 260. For the eye opening monitor device 200, the phase interpolator 110, the sampling circuit 120, the sampling circuit 130, and the clock centering circuit 140 shown in FIG. 2, reference may be made to the related descriptions of the eye opening monitor device 100, the phase interpolator 110, the sampling circuit 120, and the clock centering circuit 140 shown in FIG. 1; and/or for the eye opening monitor device 100, the phase interpolator 110, the sampling circuit 120, the sampling circuit 130, and the clock centering circuit 140 shown in FIG. 1, reference may be made to the related descriptions of the eye opening monitor device 200, the phase interpolator 110, the sampling circuit 120, the sampling circuit 130, and the clock centering circuit 140 shown in FIG. 2.

The CDR circuit 250 may provide receive data RXD, the data clock D_CLK, and an edge clock E_CLK. The embodiment does not limit the specific implementation of the CDR circuit 250. According to actual design, in some embodiments, the CDR circuit 250 may include a conventional CDR circuit or other CDR circuits. The data switch circuit 260 is coupled to the CDR circuit 250 to receive the data clock D_CLK and the receive data RXD. The data switch circuit 260 is coupled to the sampling circuit 120, the sampling circuit 130, and a sense amplifier (sense amplifier) 280 to provide a data signal SD. The data switch circuit 260 may selectively output the test data TD as the data signal SD during a centering period. The data switch circuit 260 may selectively output the receive data RXD as the data signal SD during a normal operation period.

The embodiment does not limit the specific implementation of the data switch circuit 260. According to actual design, in the embodiment shown in FIG. 2, the data switch circuit 260 may include a frequency divider 261, a multiplexer 262, and an equalizer 263. An input terminal of the frequency divider 261 is coupled to the CDR circuit 250 to receive the data clock D_CLK. The clock centering circuit 140 may control/determine a frequency division ratio of the frequency divider 261. Based on the frequency division ratio, the frequency divider 261 may divide the data clock D_CLK to generate test data TD (that is, a divided clock). A first input terminal of the multiplexer 262 is coupled to an output terminal of the frequency divider 261 to receive the test data TD. A second input terminal of the multiplexer 262 is coupled to the CDR circuit 250 to receive the receive data RXD. An output terminal of the multiplexer 262 is coupled to an input terminal of the equalizer 263. Based on the control of the clock centering circuit 140, the multiplexer 262 may select to output the test data TD to the equalizer 263 during the centering period, and select to output the receive data RXD to the equalizer 263 during the normal operation period. An output terminal of the equalizer 263 is coupled to the sampling circuit 120, the sampling circuit 130, and the sense amplifier 280 to provide the data signal SD.

In the embodiment shown in FIG. 2, the sampling circuit 120 includes a buffer 121, a sense amplifier 122, and a deserializer 123. An input terminal of the buffer 121 is coupled to the phase interpolator 110 to receive the phase interpolation clock PI_CLK. A clock terminal of the sense amplifier 122 is coupled to an output terminal of the buffer 121 to receive a buffered phase interpolation clock. An input terminal of the sense amplifier 122 is coupled to the output terminal of the equalizer 263 to receive the data signal SD. An output terminal of the sense amplifier 122 outputs a sampled data string to the deserializer 123. An input terminal of the deserializer 123 is coupled to the output terminal of the sense amplifier 122 to receive the sampled data string. An output terminal of the deserializer outputs the sampled data PI_D to the clock centering circuit 140.

In the embodiment shown in FIG. 2, the sampling circuit 130 includes a buffer 131, a sense amplifier 132, and a deserializer 133. An input terminal of the buffer 131 is coupled to the CDR circuit 250 to receive the data clock D_CLK. A clock terminal of the sense amplifier 132 is coupled to an output terminal of the buffer 131 to receive a buffered data clock. An input terminal of the sense amplifier 132 is coupled to the output terminal of the equalizer 263 to receive the data signal SD. An output terminal of the sense amplifier 132 outputs a sampled data string to the deserializer 133. An input terminal of the deserializer 133 is coupled to the output terminal of the sense amplifier 132 to receive the sampled data string. An output terminal of the deserializer 133 outputs the sampled data D_D to the clock centering circuit 140.

An input terminal of a buffer 270 is coupled to the CDR circuit 250 to receive the edge clock E_CLK. A clock terminal of the sense amplifier 280 is coupled to an output terminal of the buffer 270 to receive a buffered edge clock. An input terminal of the sense amplifier 280 is coupled to the output terminal of the equalizer 263 to receive the data signal SD.

According to different design requirements, the implementation of the clock centering circuit 140 may be in the form of hardware, firmware, software (that is, program), or a combination of multiple of the three. In terms of the hardware form, the clock centering circuit 140 may be implemented as a logic circuit in an integrated circuit. The related functions of the clock centering circuit 140 may be implemented as hardware using hardware description languages (HDL) (for example, Verilog HDL or VHDL) or other suitable programming languages. For example, the related functions of the clock centering circuit 140 may be implemented in various logic blocks, modules, and circuits in one or more controllers, microcontrollers, microprocessors, application-specific integrated circuits (ASICs), digital signal processors (DSPs), field programmable gate arrays (FPGAs), and/or other processing units. In terms of the software form and/or the firmware form, the related functions of the clock centering circuit 140 may be implemented as programming codes. For example, general programming languages (for example, C, C++, or assembly languages) or other suitable programming languages are used to implement the clock centering circuit 140. The programming codes may be recorded/stored in a "non-transitory computer readable medium". In some embodiments, the non-transitory computer readable medium includes, for example, a tape, a disk, a card, a semiconductor memory, a programmable logic circuit, and/or a storage device. The storage device includes a hard disk drive (HDD), a solid-state drive (SSD), or other storage devices. A computer, a central processing unit (CPU), a controller, a microcontroller, or a microprocessor may read and execute the programming codes from the non-transitory computer readable medium, thereby implementing the clock centering circuit 140.

Figure 3:
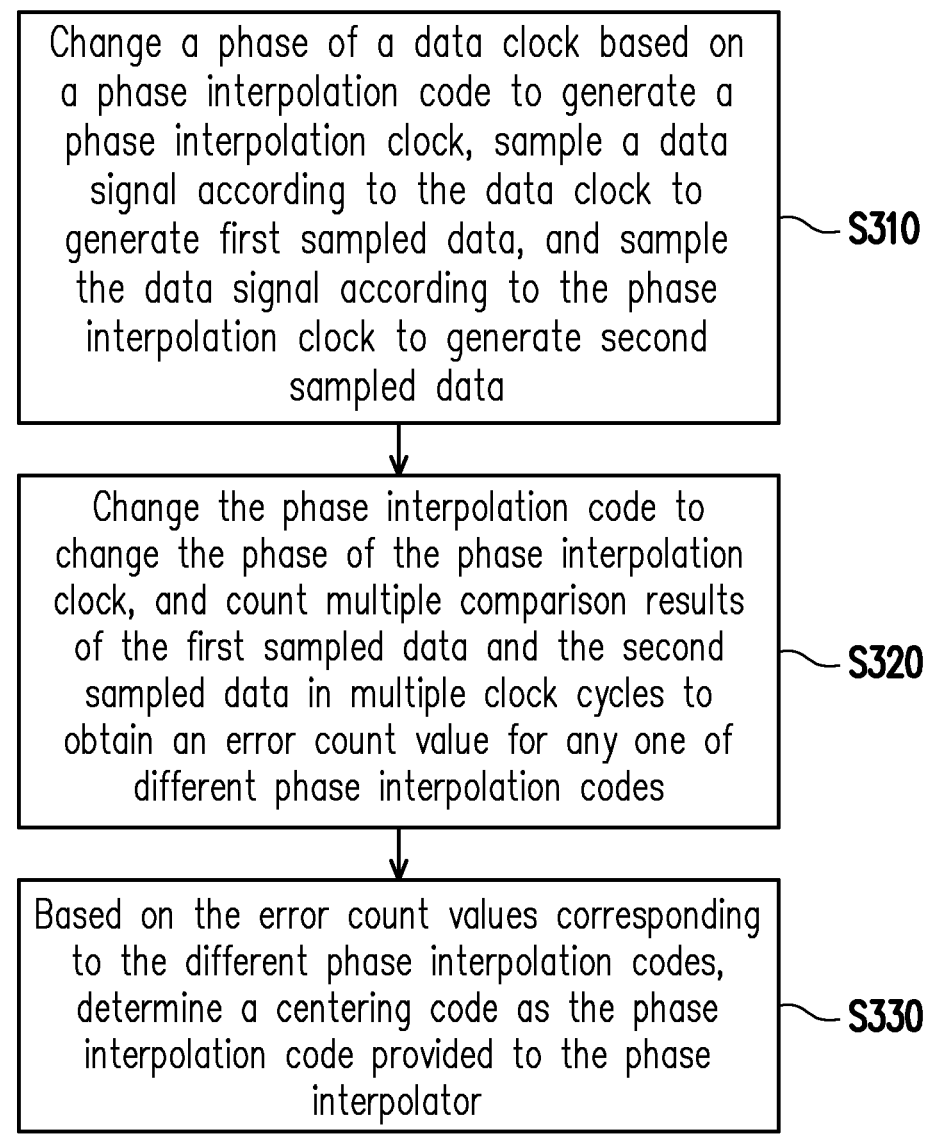
FIG. 3 is a schematic diagram of a process of an operation method of an eye opening monitor device according to an embodiment of the disclosure.

FIG. 3 is a schematic diagram of a process of an operation method of an eye opening monitor device according to an embodiment of the disclosure. Please refer to FIG. 2 (or FIG. 1) and FIG. 3. In Step S310, the phase interpolator 110 may change a phase of the data clock D_CLK based on a phase interpolation code PI_CODE to generate the phase interpolation clock PI_CLK, the sampling circuit 120 may sample the data signal SD according to a timing of the phase interpolation clock PI_CLK to generate the sampled data PI_D, and the sampling circuit 130 may sample the data signal SD according to the data clock D_CLK to generate the sampled data D_D.

In Step S320, the clock centering circuit 140 may change the phase interpolation code PI_CODE to change the phase of the phase interpolation clock PI_CLK generated by the phase interpolator 110, and then compare the sampled data PI_D and the sampled data D_D to obtain a comparison result. For example, the clock centering circuit 140 may check and compare whether the sampled data PI_D and the sampled data D_D are the same. The clock centering circuit 140 may also count multiple comparison results in multiple clock cycles to obtain an error count value for any one of different phase interpolation codes PI_CODE in Step S320. For example, the clock centering circuit 140 may count the number of errors in the sampled data PI_D compared to the sampled data D_D in multiple clock cycles to obtain an error count value for one phase interpolation code PI_CODE, and count the number of errors in the sampled data PI_D in multiple clock cycles to obtain another error count value for another phase interpolation code PI_CODE. In Step S330, the clock centering circuit 140 may determine/lock a centering code as the phase interpolation code PI_CODE provided to the phase interpolator 110 based on the error count values corresponding to the different phase interpolation codes PI_CODE.

Figure 4:
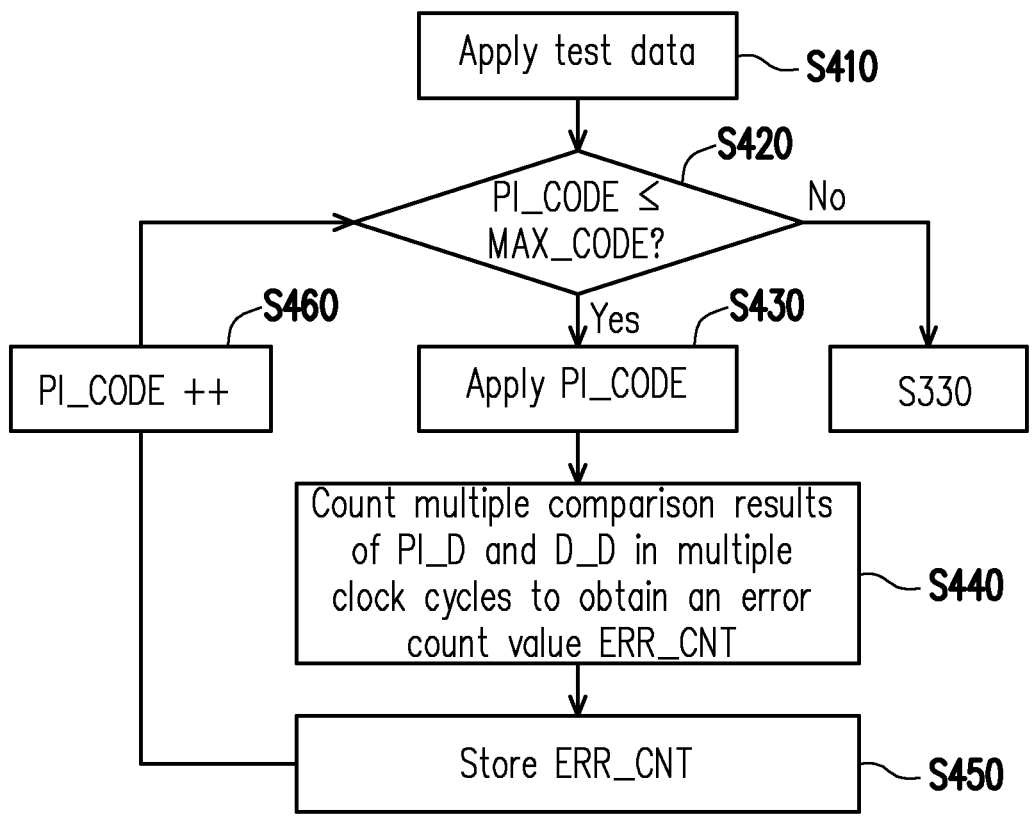
FIG. 4 is a schematic diagram of a process of Step S320 shown in FIG. 3 according to an embodiment of the disclosure.

The specific implementation details of Step S320 shown in FIG. 3 may be determined according to actual design. For example, FIG. 4 is a schematic diagram of a process of Step S320 shown in FIG. 3 according to an embodiment of the disclosure. In the embodiment shown in FIG. 4, Step S320 includes Steps S410, S420, S430, S440, S450, and S460. In Step S410, the test data TD is applied (or selected) as the data signal SD. For example, the frequency divider 261 may perform a frequency division operation of double frequency on the data clock D_CLK to generate the test data TD in Step S410. That is, the data clock D_CLK may be used as the test data TD in Step S410. Next, the clock centering circuit 140 may scan the different phase interpolation codes PI_CODE to statisticize the error count value corresponding to each phase interpolation code PI_CODE. Before proceeding to Step S420, the clock centering circuit 140 may reset the current phase interpolation code PI_CODE to an initial value (for example, reset to 0).

In Step S420, the clock centering circuit 140 may check whether the current phase interpolation code PI_CODE exceeds a rated interpolation code MAX_CODE. The rated interpolation code MAX_CODE may be determined according to actual design requirements. For example, in some embodiments, a value range of the phase interpolation code PI_CODE is 0 to 63, so the rated interpolation code MAX_CODE may be "63". When the current phase interpolation code PI_CODE does not exceed the rated interpolation code MAX_CODE (a judgment result of Step S420 is "Yes"), the clock centering circuit 140 may proceed to Step S430.

In Step S430, the clock centering circuit 140 may apply the current phase interpolation code PI_CODE, that is, provide the current phase interpolation code PI_CODE to the phase interpolator 110. Based on the phase interpolation code PI_CODE provided by the clock centering circuit 140, the phase interpolator 110 may adjust the phase of the phase interpolation clock PI_CLK to the phase corresponding to the current phase interpolation code PI_CODE. That is, an X-axis position of a rising edge (or a falling edge) of the phase interpolation clock PI_CLK in an eye pattern corresponds to the current phase interpolation code PI_CODE.

In Step S440, the clock centering circuit 140 may compare the sampled data PI_D and the sampled data D_D in multiple clock cycles to obtain multiple comparison results.

For example, the clock centering circuit 140 may check and compare whether the sampled data PI_D and the sampled data D_D are the same in a first clock cycle to obtain a first comparison result. The operations of the clock centering circuit 140 in other clock cycles may be deduced by analogy. The number of clock cycles for running Step S440 may be determined according to actual design (or actual application). For example, in some embodiments, the clock centering circuit 140 may compare the sampled data PI_D and the sampled data D_D in 10,000 clock cycles to obtain 10,000 comparison results. In other embodiments, the clock centering circuit 140 may compare the sampled data PI_D and the sampled data D_D in 100,000 clock cycles to obtain 100,000 comparison results.

The clock centering circuit 140 may also count multiple comparison results in multiple clock cycles to obtain an error count value ERR_CNT for the current phase interpolation code PI_CODE in Step S440. For example, the clock centering circuit 140 may count the number of errors in the sampled data PI_D compared to the sampled data D_D (that is, the number of times that the sampled data PI_D is not equal to the sampled data D_D) in multiple clock cycles to obtain the error count value ERR_CNT corresponding to the current phase interpolation code PI_CODE.

After Step S440 is completed, the clock centering circuit 140 may perform Step S450. In Step S450, the clock centering circuit 140 may store/reserve the error count value ERR_CNT corresponding to the current phase interpolation code PI_CODE, and then proceed to Step S460. In Step S460, the clock centering circuit 140 may increase the current phase interpolation code PI_CODE. For example, the clock centering circuit 140 may increase the phase interpolation code PI_CODE by one step. After increasing the phase interpolation code PI_CODE, the clock centering circuit 140 may perform Step S420 again to check whether the current phase interpolation code PI_CODE exceeds the rated interpolation code MAX_CODE. When the current phase interpolation code PI_CODE exceeds the rated interpolation code MAX_CODE (the judgment result of Step S420 is "No"), the clock centering circuit 140 may perform Step S330.

Figure 5:
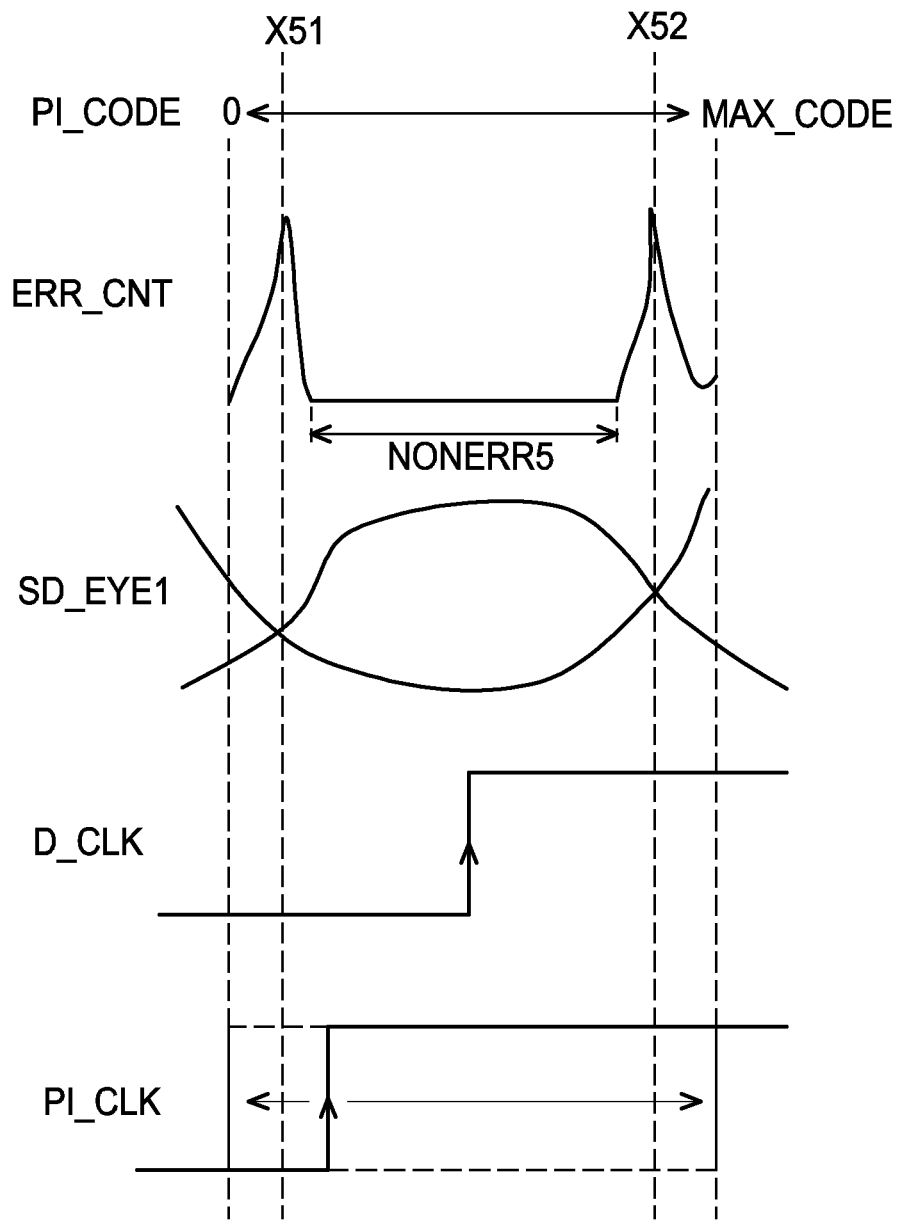
FIG. 5 is a schematic diagram of a specific operation example of a process shown in FIG. 4 according to an embodiment of the disclosure.

FIG. 5 is a schematic diagram of a specific operation example of a process shown in FIG. 4 according to an embodiment of the disclosure. The upper part of FIG. 5 shows a graph of the error count value ERR_CNT, wherein the vertical axis represents the error count value ERR_CNT (that is, the number of times that the sampled data PI_D is not equal to the sampled data D_D), and the horizontal axis represents the phase interpolation code PI_CODE. The value range of the phase interpolation code PI_CODE is 0 to MAX_CODE, wherein the rated interpolation code MAX_CODE may be determined according to actual design requirements. FIG. 5 also shows an eye pattern SD_EYE1 of the data signal SD, the data clock D_CLK, and the phase interpolation clock PI_CLK. The clock centering circuit 140 may change the phase interpolation code PI_CODE to change the phase of the phase interpolation clock PI_CLK generated by the phase interpolator 110, and then check and compare whether the sampled data PI_D and the sampled data D_D are the same to obtain the comparison result. For any one of the different phase interpolation codes PI_CODE, the clock centering circuit 140 may count multiple comparison results in multiple clock cycles to obtain the error count value ERR_CNT. For example, the clock centering circuit 140 may count the number of errors in the sampled data PI_D (that is, the number of times that PI_D is different from D_D) in 10,000 clock cycles to obtain the error count value ERR_CNT for the phase interpolation code PI_CODE, and count the number of errors in the sampled data PI_D in the next 10,000 clock cycles to obtain another error count value ERR_CNT for another phase interpolation code PI_CODE. After completing the scanning of the phase interpolation code PI_CODE, the clock centering circuit 140 may obtain the graph of the error count value ERR_CNT shown in the upper part of FIG. 5.

Figure 6:
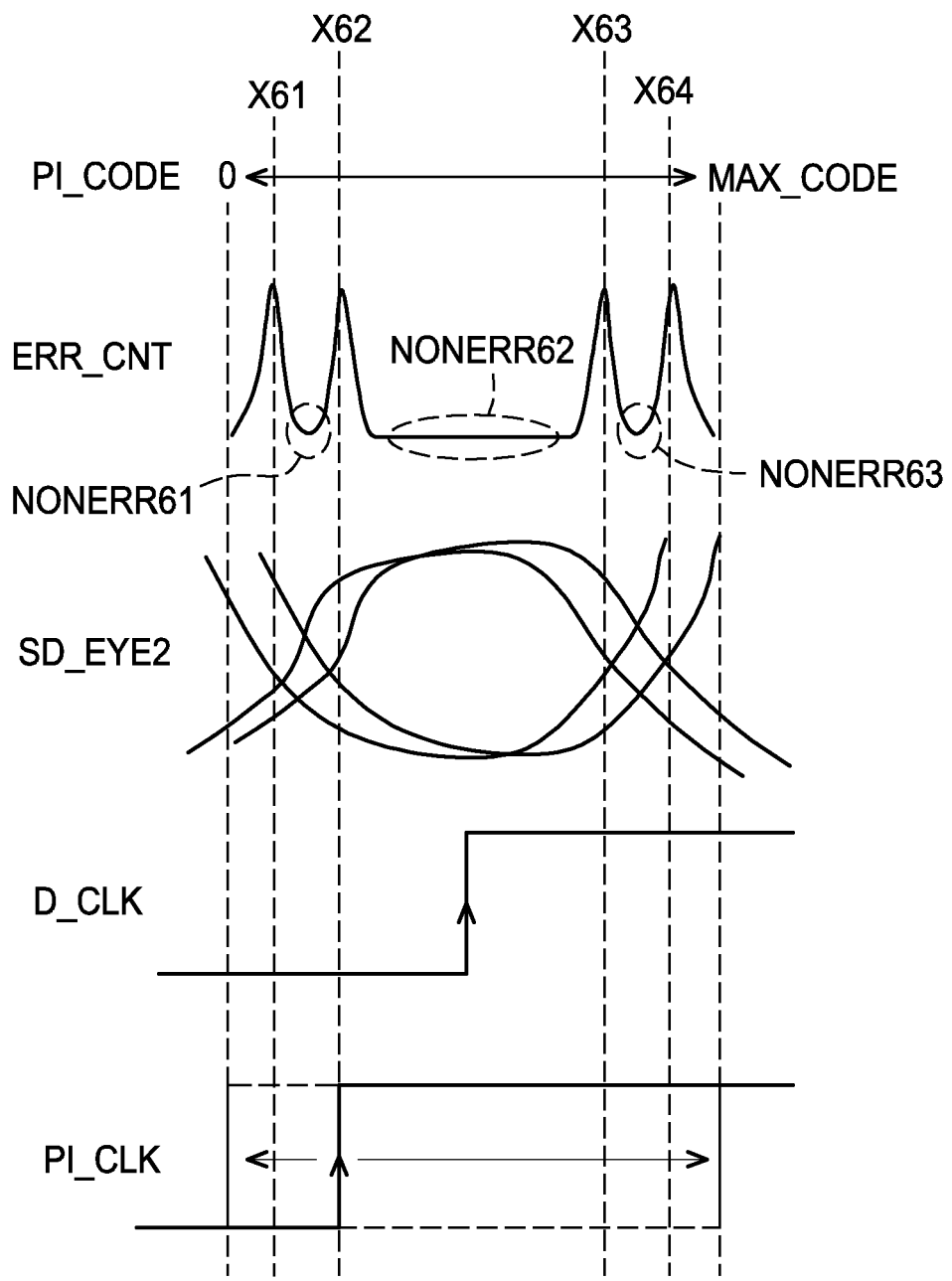
FIG. 6 is a schematic diagram of a specific operation example of a process shown in FIG. 4 according to another embodiment of the disclosure.

FIG. 6 is a schematic diagram of a specific operation example of a process shown in FIG. 4 according to another embodiment of the disclosure. An eye pattern SD_EYE2 of the data signal SD shown in FIG. 6 indicates that the data signal SD experiences noise interference, causing false eyes in the eye pattern SD_EYE2. FIG. 6 also shows the data clock D_CLK and the phase interpolation clock PI_CLK. The clock centering circuit 140 may change the phase interpolation code PI_CODE to change the phase of the phase interpolation clock PI_CLK generated by the phase interpolator 110, and then check and compare whether the sampled data PI_D and the sampled data D_D are the same to obtain the comparison result.

The upper part of FIG. 6 shows a graph of the error count value ERR_CNT, wherein the vertical axis represents the error count value ERR_CNT (that is, the number of times that the sampled data PI_D is not equal to the sampled data D_D), and the horizontal axis represents the phase interpolation code PI_CODE. The value range of the phase interpolation code PI_CODE is 0 to MAX_CODE. For any one of the different phase interpolation codes PI_CODE, the clock centering circuit 140 may count multiple comparison results in multiple clock cycles to obtain the error count value ERR_CNT. After completing the scanning of the phase interpolation code PI_CODE, the clock centering circuit 140 may obtain the graph of the error count value ERR_CNT shown in the upper part of FIG. 6.

The specific implementation details of Step S330 shown in FIG. 3 may be determined according to actual design. For example, in some embodiments, the clock centering circuit 140 may scan the different phase interpolation codes PI_CODE to find one or more continuous regions of a count value indicating no error in the error count values ERR_CNT (for example, the curve of the error count value ERR_CNT shown in FIG. 5 or FIG. 6) of the different phase interpolation codes PI_CODE, and select one of the different phase interpolation codes in the continuous region (or the largest continuous region of the continuous regions) as the centering code. The definition of the "count value indicating no error" may be determined according to actual design. For example, in some embodiments, the "count value indicating no error" may be "0". In other embodiments, the "count value indicating no error" may be "a count value less than a certain threshold value", wherein the threshold value may be an integer determined according to actual design.

If the curve of the error count value ERR_CNT shown in FIG. 5 is taken as an example, the "continuous region of the count value indicating no error" may be a continuous region NONERR5 shown in FIG. 5. The clock centering circuit 140 may select one of the different phase interpolation codes of the continuous region NONERR5 as the centering code.

If the curve of the error count value ERR_CNT shown in FIG. 6 is taken as an example, the "continuous region of the count value indicating no error" may be continuous regions NONERR61, NONERR62, and NONERR63 shown in FIG. 6. The clock centering circuit 140 may select/reserve the largest continuous region NONERR62 from the continuous regions NONERR61, NONERR62, and NONERR63, and omit/discard the small continuous regions NONERR61 and NONERR63. The clock centering circuit 140 may select one of the different phase interpolation codes in the largest continuous region NONERR62 as the centering code.

Figure 7:
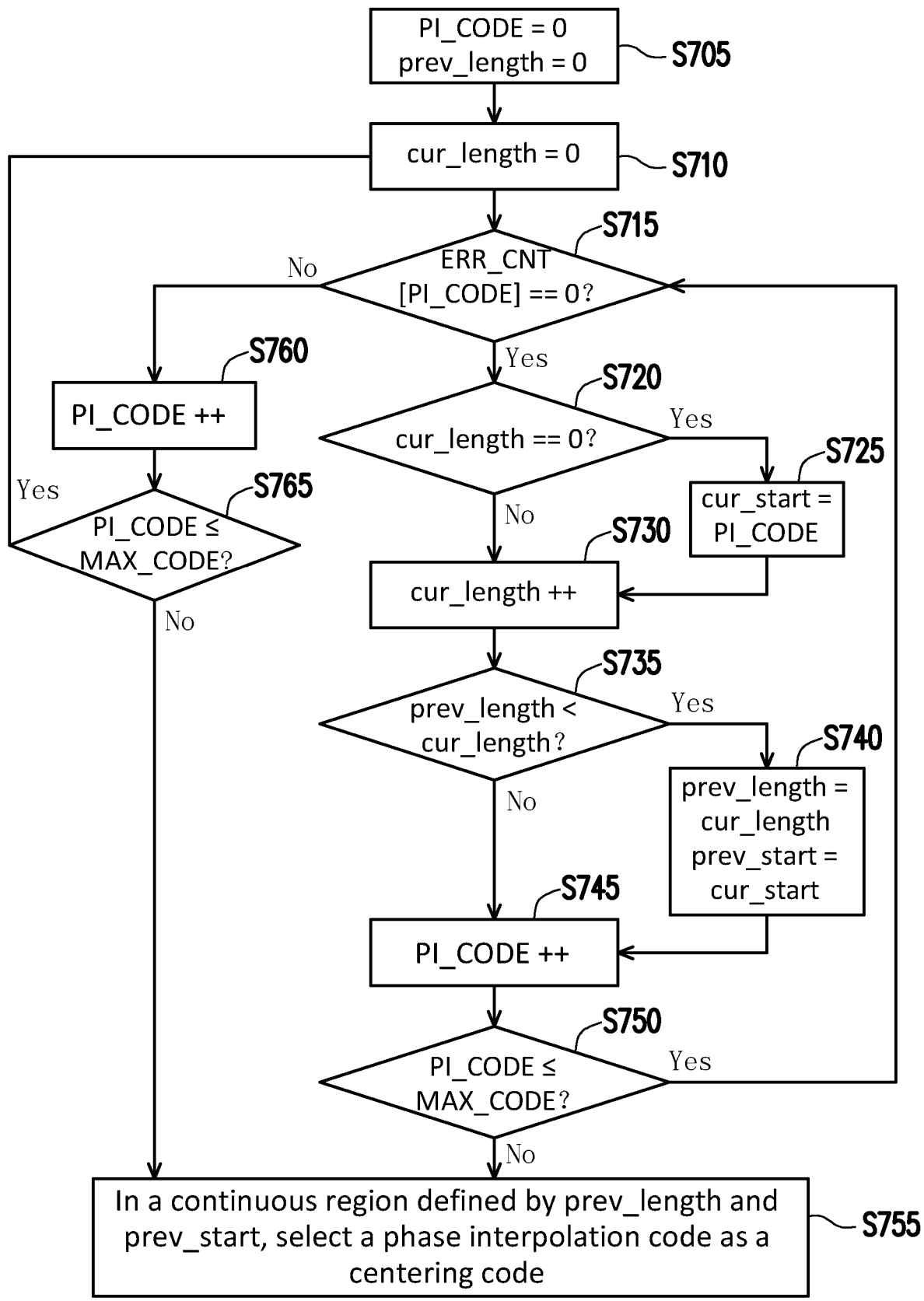
FIG. 7 is a schematic diagram of a process of Step S330 shown in FIG. 3 according to an embodiment of the disclosure.

FIG. 7 is a schematic diagram of a process of Step S330 shown in FIG. 3 according to an embodiment of the disclosure. In the embodiment shown in FIG. 7, Step S330 includes Steps S705, S710, S715, S720, S725, S730, S735, S740, S745, S750, S755, S760, and S765. In Step S705, the current phase interpolation code PI_CODE is reset to 0, and a previous length prev_length is also reset to 0. In Step S710, a current length cur_length is reset to 0.

The clock centering circuit 140 may check whether the error count value ERR_CNT corresponding to the current phase interpolation code PI_CODE is the "count value indicating no error" in Step S715. In the embodiment shown in FIG. 7, the "count value indicating no error" may be "0". When the error count value ERR_CNT corresponding to the current phase interpolation code PI_CODE is 0 (a judgment result of Step S715 is "Yes"), the clock centering circuit 140 may execute Step S720. The clock centering circuit 140 may check whether the current length cur_length is 0 in Step S720. When the current length cur_length is 0 (a judgment result of Step S720 is "Yes"), the clock centering circuit 140 may execute Step S725 to set a current starting position cur_start to the current phase interpolation code PI_CODE. When the current length cur_length is not 0 (the judgment result of Step S720 is "No"), the clock centering circuit 140 may execute Step S730.

In Step S730, the clock centering circuit 140 may increase the current length cur_length by one step. In Step S735, the clock centering circuit 140 may check whether the previous length prev_length is less than the current length cur_length. When the previous length prev_length is less than the current length cur_length (a judgment result of Step S735 is "Yes"), the clock centering circuit 140 may execute Step S740 to set the previous length prev_length to the current length cur_length and set a previous starting position prev_start to the current starting position is cur_start. When the previous length prev_length is not less than the current length cur_length (the judgment result of Step S735 is "No"), the clock centering circuit 140 may execute Step S745.

In Step S745, the clock centering circuit 140 may increase the current phase interpolation code PI_CODE by one step. In Step S750, the clock centering circuit 140 may check whether the current phase interpolation code PI_CODE exceeds the rated interpolation code MAX_CODE. When the current phase interpolation code PI_CODE exceeds the rated interpolation code MAX_CODE (a judgment result of Step S750 is "No"), the clock centering circuit 140 may execute Step S755. When the current phase interpolation code PI_CODE has not exceeded the rated interpolation code MAX_CODE (the judgment result of Step S750 is "Yes"), the clock centering circuit 140 may return to Step S715.

When the error count value ERR_CNT corresponding to the current phase interpolation code PI_CODE is not 0 (the judgment result of Step S715 is "No"), the clock centering circuit 140 may execute Step S760. In Step S760, the clock centering circuit 140 may increase the current phase interpolation code PI_CODE by one step. In Step S765, the clock centering circuit 140 may check whether the current phase interpolation code PI_CODE exceeds the rated interpolation code MAX_CODE. When the current phase interpolation code PI_CODE has not exceeded the rated interpolation code MAX_CODE (a judgment result of Step S765 is "Yes"), the clock centering circuit 140 may return to Step S710.

When the current phase interpolation code PI_CODE exceeds the rated interpolation code MAX_CODE (the judgment result of Step S765 is "No"), the clock centering circuit 140 may execute Step S755. In Step S755, the clock centering circuit 140 may select a phase interpolation code in a continuous region defined by the previous starting position prev_start and the previous length prev_length as the centering code. According to actual design, in some embodiments, the clock centering circuit 140 may calculate the phase interpolation code=prev_start+(prev_length)/2 as the centering code.

The specific implementation details of Step S330 shown in FIG. 3 are not limited to the related description of FIG. 7. For example, in other embodiments, the clock centering circuit 140 may scan the different phase interpolation codes PI_CODE to find multiple reference phase interpolation codes with error count peak values in the different phase interpolation codes PI_CODE. Then, the clock centering circuit 140 may use the reference phase interpolation codes to calculate the centering code.

Figure 8:
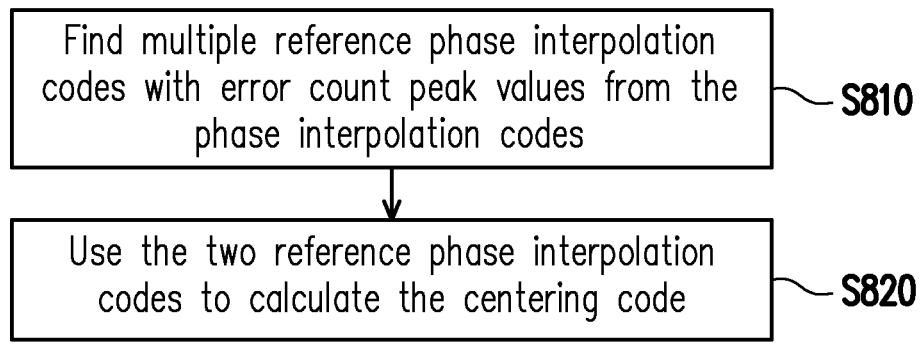
FIG. 8 is a schematic diagram of a process of Step S330 shown in FIG. 3 according to another embodiment of the disclosure.

FIG. 8 is a schematic diagram of a process of Step S330 shown in FIG. 3 according to another embodiment of the disclosure. In the embodiment shown in FIG. 7, Step S330 includes Steps S810 and S820. In Step S810, the clock centering circuit 140 may scan the different phase interpolation codes PI_CODE to find multiple reference phase interpolation codes with error count peak values from the phase interpolation codes PI_CODE. In Step S820, the clock centering circuit 140 may use the reference phase interpolation codes to calculate the centering code.

If the curve of the error count value ERR_CNT shown in FIG. 5 is taken as an example, the clock centering circuit 140 may find two reference phase interpolation codes X51 and X52 with error count peak values from the phase interpolation codes PI_CODE (Step S810). The clock centering circuit 140 may use the two reference phase interpolation codes X51 and X52 to calculate the centering code in Step S820. For example, in some embodiments, the clock centering circuit 140 may calculate (X51+X52)/2 as the centering code in Step S820.

If the curve of the error count value ERR_CNT shown in FIG. 6 is taken as an example, the clock centering circuit 140 may find four reference phase interpolation codes X61, X62, X63, and X64 with error count peak values from the phase interpolation codes PI_CODE (Step S810). The clock centering circuit 140 may use the four reference phase interpolation codes X61, X62, X63, and X64 to calculate the centering code in Step S820. For example, in some embodiments, the clock centering circuit 140 may calculate Y61=(X61+X62)/2, and calculate Y62=(X63+X64)/2 in Step S820. Next, the clock centering circuit 140 may calculate (Y61+Y62)/2 as the centering code.

Figure 9:
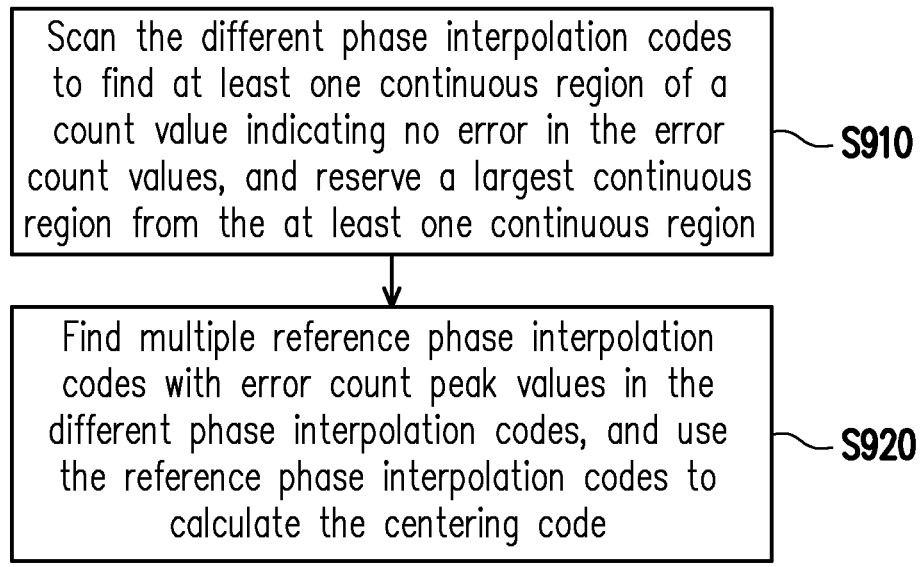
FIG. 9 is a schematic diagram of a process of Step S330 shown in FIG. 3 according to yet another embodiment of the disclosure.

The specific implementation details of Step S330 shown in FIG. 3 are not limited to the related descriptions of FIG. 7 and FIG. 8. For example, FIG. 9 is a schematic diagram of a process of Step S330 shown in FIG. 3 according to yet another embodiment of the disclosure. In the embodiment shown in FIG. 9, Step S330 includes Steps S910 and S920. In Step S910, the clock centering circuit 140 may scan the different phase interpolation codes PI_CODE to find at least one continuous region of the count value indicating no error in the error count values ERR_CNT, and then reserve the largest continuous region from the at least one continuous region. According to actual design, in some embodiments, for the implementation details of Step S910 according to FIG. 9, reference may be made to the related details of FIG. 10.

Figure 10:
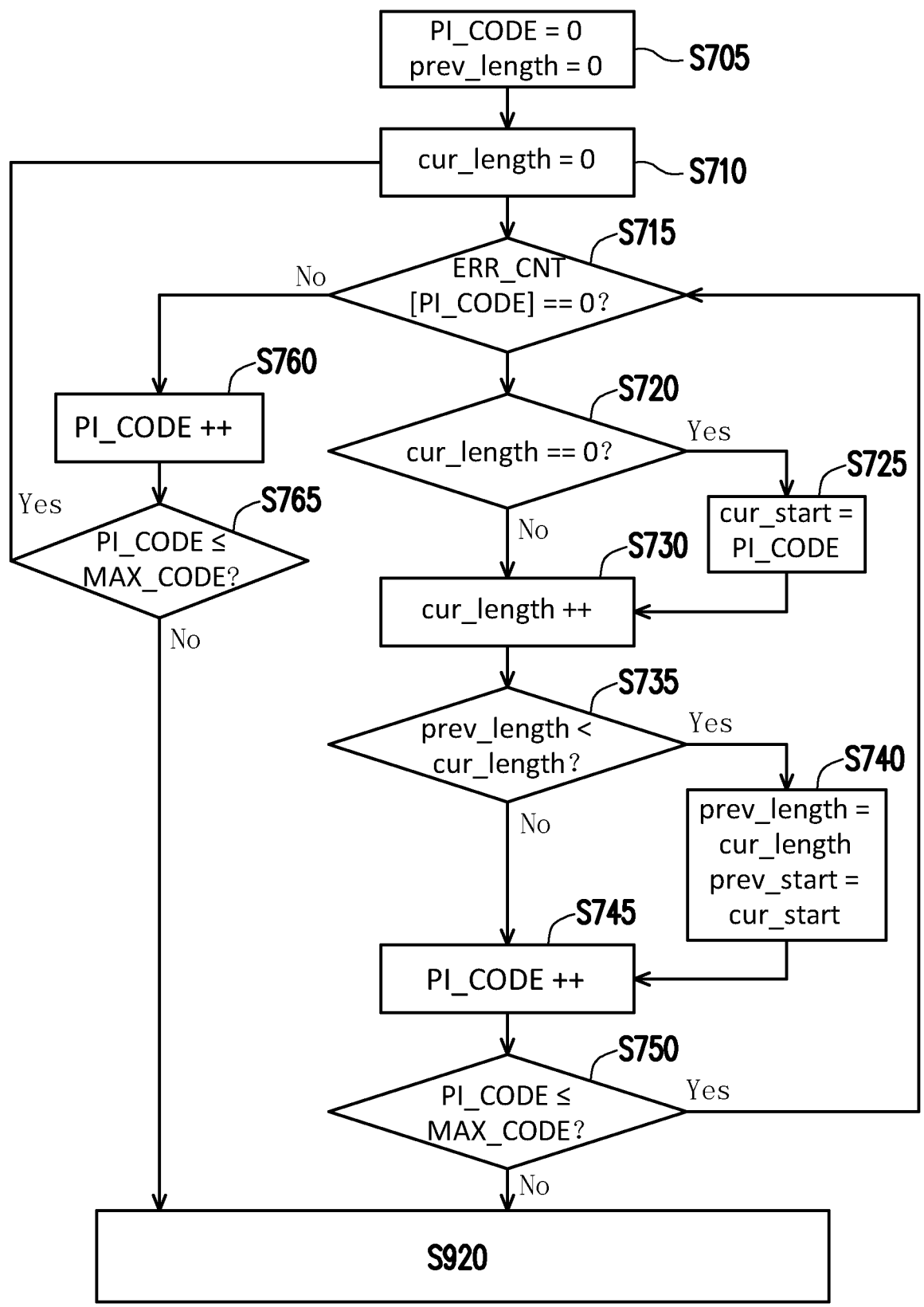
FIG. 10 is a schematic diagram of a process of Step S910 shown in FIG. 9 according to an embodiment of the disclosure.

FIG. 10 is a schematic diagram of a process of Step S910 shown in FIG. 9 according to an embodiment of the disclosure. In the embodiment shown in FIG. 10, Step S330 includes Steps S705, S710, S715, S720, S725, S730, S735, S740, S745, S750, S760, and S765. Steps S705, S710, S715, S720, S725, S730, S735, S740, S745, S750, S760, and S765 shown in FIG. 10 may be deduced by analogy with reference to the related descriptions of Steps S705, S710, S715, S720, S725, S730, S735, S740, S745, S750, S760, and S765 shown in FIG. 7, so there will be no repetition. The difference from the embodiment shown in FIG. 7 is that in the embodiment shown in FIG. 10, when the judgment result of Step S750 (or Step S765) is "No", the clock centering circuit 140 executes Step S920.

In Step S920 shown in FIG. 9, the clock centering circuit 140 may find multiple reference phase interpolation codes with error count peak values in the different phase interpolation codes PI_CODE. Then, the clock centering circuit 140 may use the reference phase interpolation codes to calculate the centering code. Step S920 shown in FIG. 9 may be deduced by analogy with reference to the related description of the process shown in FIG. 8, so there will be no repetition.

Figure 11:
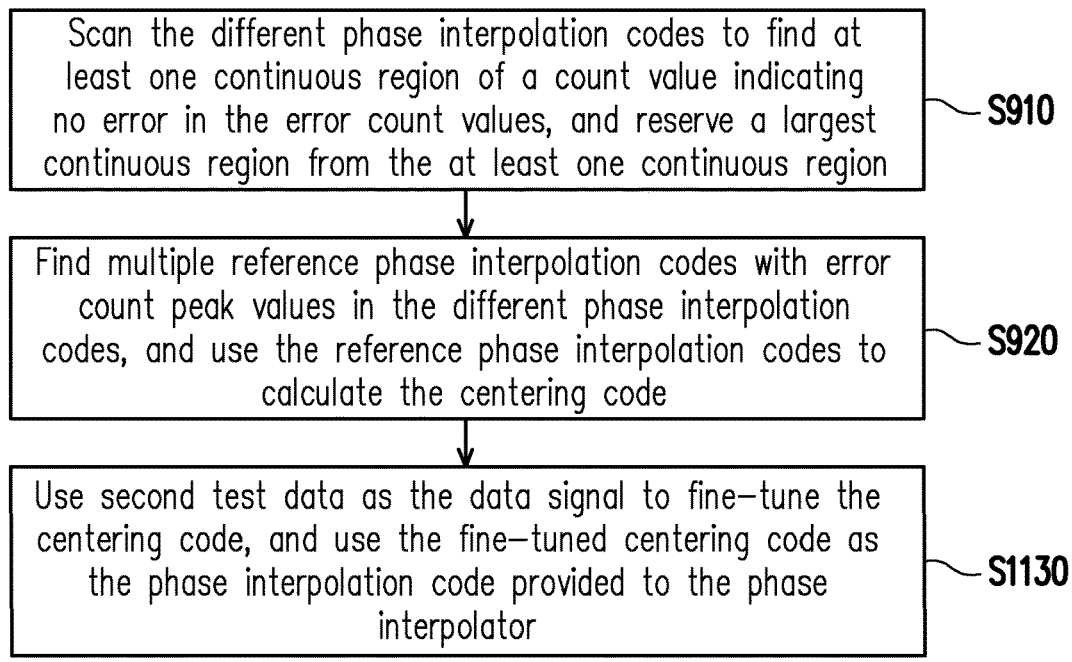
FIG. 11 is a schematic diagram of a process of Step S330 shown in FIG. 3 according to still another embodiment of the disclosure.

The specific implementation details of Step S330 shown in FIG. 3 are not limited to the related description of FIG. 7, FIG. 8, or FIG. 9. For example, FIG. 11 is a schematic diagram of a process of Step S330 shown in FIG. 3 according to still another embodiment of the disclosure. In the embodiment shown in FIG. 11, Step S330 includes Steps S910, S920, and S1130. Steps S910 and S920 shown in FIG. 11 may be deduced by analogy with reference to the related descriptions of Steps S910 and S920 shown in FIG. 9, so there will be no repetition.

The data signal SD (first test data) used in Step S320 shown in FIG. 3 is different from the data signal SD (second test data) used in Step S1130 shown in FIG. 11. For example, the first test data is a first clock signal, and the second test data is a second clock signal, wherein the period of the first clock signal is less than the period of the second clock signal.

After determining the centering code (that is, after Step S920), the clock centering circuit 140 may control the frequency divider 261 to perform a frequency division operation of double frequency on the data clock D_CLK to generate the test data TD. That is, assuming that the period of the data clock D_CLK is T, the data signal SD (the second test data) at this time may be a clock signal with a period of 2T. The second test data may be used to fine-tune the centering code. In Step S1130 shown in FIG. 11, the sampling circuit 130 samples the second test data (the data signal SD) according to the data clock D_CLK to generate third sampled data (the sampled data D_D), and the sampling circuit 120 samples the second test data (the data signal SD) according to the phase interpolation clock PI_CLK to generate fourth sampled data (the sampled data PI_D). The clock centering circuit 140 may check the third sampled data and the fourth sampled data to determine whether to fine-tune the centering code. The clock centering circuit 140 may use the fine-tuned centering code as the phase interpolation code PI_CODE provided to the phase interpolator 110.

Figure 12:
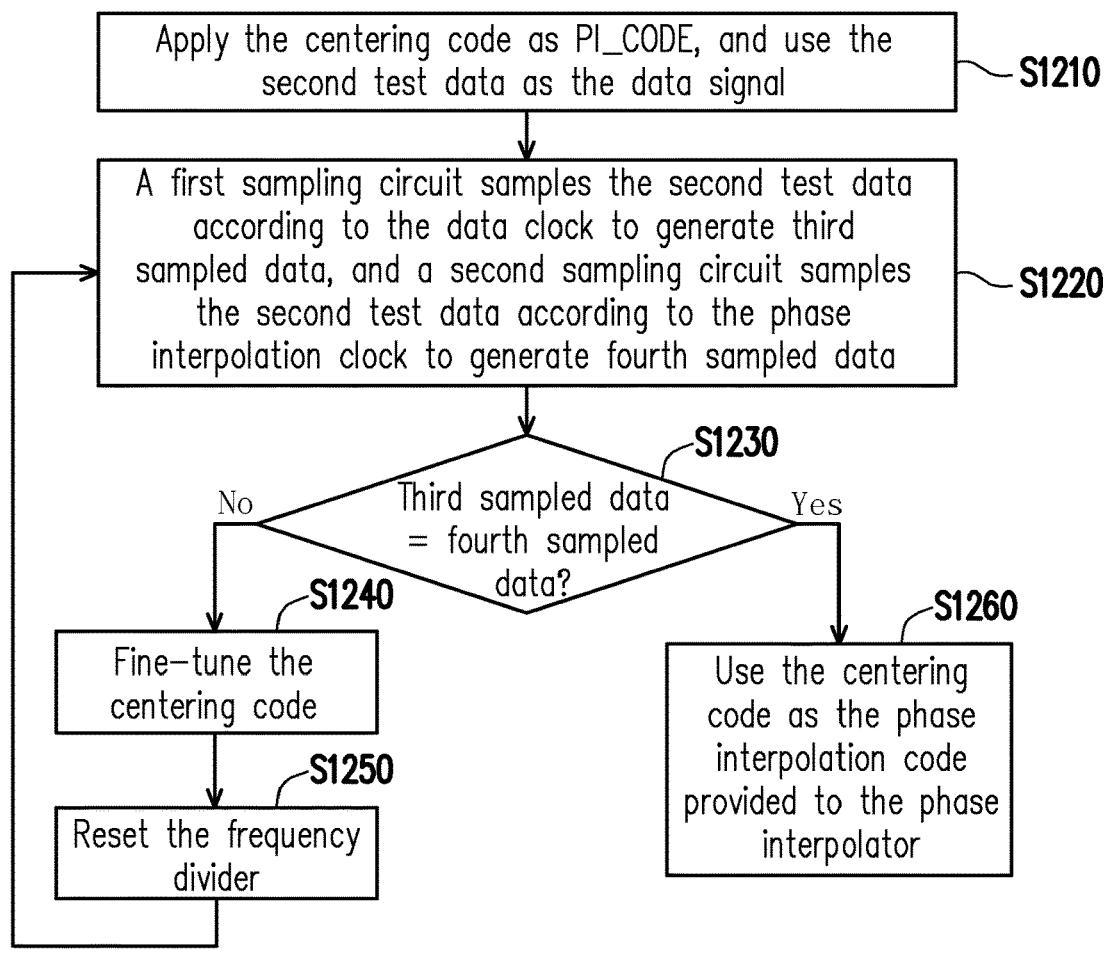
FIG. 12 is a schematic diagram of a process of Step S1130 shown in FIG. 11 according to an embodiment of the disclosure.

FIG. 12 is a schematic diagram of a process of Step S1130 shown in FIG. 11 according to an embodiment of the disclosure. In the embodiment shown in FIG. 12, Step S1130 includes Steps S1210, S1220, S1230, S240, S1250, and S1260. In Step S1210, the test data TD (the second test data) with a period of 2T is applied as the data signal SD, and the centering code calculated in Step S920 is applied as the phase interpolation code PI_CODE provided to the phase interpolator 110. In Step S1220, the sampling circuit 130 samples the second test data (the data signal SD) according to the data clock D_CLK to generate the third sampled data (the sampled data D_D), and the sampling circuit 120 samples the second test data (the data signal SD) according to the phase interpolation clock PI_CLK to generate the fourth sampled data (the sampled data PI_D). In Step S1230, the clock centering circuit 140 may check the third sampled data and the fourth sampled data to determine whether to fine-tune the centering code. When the third sampled data is different from the fourth sampled data (that is, a judgment result of Step S1230 is "No"), the clock centering circuit 140 may perform Step S1240.

In Step S1240, the clock centering circuit 140 may fine-tune the centering code, that is, fine-tune the current phase interpolation code PI_CODE. For example, in some embodiments, the clock centering circuit 140 may increase the current phase interpolation code PI_CODE by one step in Step S1240. In other embodiments, the clock centering circuit 140 may decrease the current phase interpolation code PI_CODE by one step in Step S1240. In Step S1250, the clock centering circuit 140 can reset the frequency divider 261. After resetting the frequency divider 261, the clock centering circuit 140 may return to Step S1220 to generate the third sampled data (the sampled data D_D) and the fourth sampled data (the sampled data PI_D) again. When the third sampled data is the same as the fourth sampled data (that is, the judgment result of Step S1230 is "Yes"), the clock centering circuit 140 may perform Step S1260. The clock centering circuit 140 may use the fine-tuned centering code as the phase interpolation code PI_CODE provided to the phase interpolator 110 in Step S1260.

In summary, the eye opening monitor device according to the above embodiments may change the phase of the phase interpolation clock PI_CLK generated by the phase interpolator 110 by changing the phase interpolation code PI_CODE, and then compare the sampled data PI_D and the sampled data D_D to obtain the comparison result. For any one of the different phase interpolation codes PI_CODE, the clock centering circuit 140 may count/statisticize multiple comparison results in multiple clock cycles (for example, count the number of errors in the clock cycles) to obtain the error count value ERR_CNT corresponding to a certain phase interpolation code PI_CODE. The clock centering circuit 140 may determine/lock the phase interpolation code PI_CODE (the centering code) provided to the phase interpolator 110 based on the error count values ERR_CNT corresponding to the different phase interpolation codes PI_CODE, so that the phase of the phase interpolation clock PI_CLK matches the phase of the data clock D_CLK.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:
1. An eye opening monitor device, comprising:
   a first sampling circuit, wherein the first sampling circuit receives a data clock, and the first sampling circuit is configured to sample a data signal according to the data clock to generate first sampled data;

a phase interpolator, configured to receive the data clock received by the first sampling circuit, wherein the phase interpolator changes a phase of the data clock based on a phase interpolation code to generate a phase interpolation clock;

a second sampling circuit, coupled to the phase interpolator to receive the phase interpolation clock and configured to sample the data signal according to the phase interpolation clock to generate second sampled data; and a clock centering circuit, coupled to the first sampling circuit and the second sampling circuit to receive the first sampled data and the second sampled data, wherein the clock centering circuit changes the phase interpolation code to change a phase of the phase interpolation clock, the clock centering circuit counts a plurality of comparison results of the first sampled data and the second sampled data in a plurality of clock cycles to obtain an error count value for any one of different phase interpolation codes, and the clock centering circuit determines a centering code as the phase interpolation code provided to the phase interpolator based on the error count values corresponding to the different phase interpolation codes.

2. The eye opening monitor device according to claim 1, wherein the first sampling circuit comprises:

a buffer, having an input terminal to receive the data clock;

a sense amplifier, having a clock terminal coupled to an output terminal of the buffer to receive a buffered data clock, wherein an input terminal of the sense amplifier receives the data signal, and an output terminal of the sense amplifier outputs a sampled data string; and a deserializer, having an input terminal coupled to an output terminal of the sense amplifier to receive the sampled data string, wherein an output terminal of the deserializer outputs the first sampled data to the clock centering circuit.

3. The eye opening monitor device according to claim 1, wherein the second sampling circuit comprises:

a buffer, having an input terminal coupled to the phase interpolator to receive the phase interpolation clock;

a sense amplifier, having a clock terminal coupled to an output terminal of the buffer to receive a buffered phase interpolation clock, wherein an input terminal of the sense amplifier receives the data signal, and an output terminal of the sense amplifier outputs a sampled data string; and a deserializer, having an input terminal coupled to an output terminal of the sense amplifier to receive the sampled data string, wherein an output terminal of the deserializer outputs the second sampled data to the clock centering circuit.

4. The eye opening monitor device according to claim 1, further comprising:

a clock data recovery circuit, configured to provide the data clock and receive data.

5. The eye opening monitor device according to claim 1, further comprising:

a data switch circuit, coupled to the first sampling circuit and the second sampling circuit to provide the data signal, wherein the data switch circuit selectively outputs test data as the data signal during a centering period, and the data switch circuit selectively outputs receive data as the data signal during a normal operation period.

6. The eye opening monitor device according to claim 5, wherein the data switch circuit comprises:

a frequency divider, having an input terminal for receiving the data clock, wherein an output terminal of the frequency divider outputs the test data;

a multiplexer, having a first input terminal coupled to an output terminal of the frequency divider to receive the test data, wherein a second input terminal of the multiplexer is configured to receive the receive data; and an equalizer, having an input terminal coupled to an output terminal of the multiplexer, wherein an output terminal of the equalizer is coupled to the first sampling circuit and the second sampling circuit to provide the data signal.

7. The eye opening monitor device according to claim 1, wherein the clock centering circuit scans the different phase interpolation codes to find at least one continuous region of a count value indicating no error in the error count values, and select one of the different phase interpolation codes in a largest continuous region of the at least one continuous region as the centering code.

8. The eye opening monitor device according to claim 1, wherein the clock centering circuit scans the different phase interpolation codes to find a plurality of reference phase interpolation codes with error count peak values in the different phase interpolation codes, and uses the reference phase interpolation codes to calculate the centering code.

9. The eye opening monitor device according to claim 1, wherein the clock centering circuit scans the different phase interpolation codes to find at least one continuous region of a count value indicating no error in the error count values, reserves a largest continuous region from the at least one continuous region, finds a plurality of reference phase interpolation codes with error count peak values in the different phase interpolation codes, and uses the reference phase interpolation codes to calculate the centering code.

10. The eye opening monitor device according to claim 1, wherein first test data is used as the data signal to determine the centering code, and after determining the centering code, second test data different from the first test data is used as the data signal to fine-tune the centering code.

11. The eye opening monitor device according to claim 10, wherein the first test data is a first clock signal, the second test data is a second clock signal, and a period of the first clock signal is less than a period of the second clock signal.

12. The eye opening monitor device according to claim 10, wherein the first sampling circuit samples the second test data according to the data clock to generate third sampled data, the second sampling circuit samples the second test data according to the phase interpolation clock to generate fourth sampled data, and the clock centering circuit checks the third sampled data and the fourth sampled data to determine whether to fine-tune the centering code.

13. An operation method of an eye opening monitor device, comprising:

sampling, by a first sampling circuit, a data signal according to a data clock to generate first sampled data, wherein the first sampling circuit receives the data clock;

changing, by a phase interpolator, a phase of the data clock received by the first sampling circuit based on a phase interpolation code to generate a phase interpolation clock;

sampling, by a second sampling circuit, the data signal according to the phase interpolation clock to generate second sampled data;

changing, by a clock centering circuit, the phase interpolation code to change a phase of the phase interpolation clock;

counting, by the clock centering circuit, a plurality of comparison results of the first sampled data and the second sampled data in a plurality of clock cycles to obtain an error count value for any one of different phase interpolation codes; and determining, by the clock centering circuit, a centering code based on the error count values corresponding to the different phase interpolation codes as the phase interpolation code provided to the phase interpolator.

14. The operation method according to claim 13, further comprising:

scanning, by the clock centering circuit, the different phase interpolation codes to find at least one continuous region of a count value indicating no error in the error count values: and selecting one of the different phase interpolation codes in a largest continuous region of the at least one continuous region as the centering code.

15. The operation method according to claim 13, further comprising:

scanning, by the clock centering circuit, the different phase interpolation codes to find a plurality of reference phase interpolation codes with error count peak values in the different phase interpolation codes; and using the reference phase interpolation codes to calculate the centering code.

16. The operation method according to claim 13, further comprising:

scanning, by the clock centering circuit, the different phase interpolation codes to find at least one continuous region of a count value indicating no error in the error count values;

reserving a largest continuous region from the at least one continuous region;

finding a plurality of reference phase interpolation codes with error count peak values in the different phase interpolation codes; and using the reference phase interpolation codes to calculate the centering code.

17. The operation method according to claim 13, further comprising:

using first test data as the data signal to determine the centering code; and using second test data different from the first test data as the data signal to fine-tune the centering code after determining the centering code.

18. The operation method according to claim 17, wherein the first test data is a first clock signal, the second test data is a second clock signal, and a period of the first clock signal is less than a period of the second clock signal.

19. The operation method according to claim 17, further comprising:

sampling, by the first sampling circuit, the second test data according to the data clock to generate third sampled data;

sampling, by the second sampling circuit, the second test data according to the phase interpolation clock to generate fourth sampled data; and checking, by the clock centering circuit, the third sampled data and the fourth sampled data to determine whether to fine-tune the centering code.

* * * * *